United States Patent
Panat et al.

(10) Patent No.: US 10,086,432 B2
(45) Date of Patent: Oct. 2, 2018

(54) THREE DIMENSIONAL SUB-MM WAVELENGTH SUB-THZ FREQUENCY ANTENNAS ON FLEXIBLE AND UV-CURABLE DIELECTRIC USING PRINTED ELECTRONIC METAL TRACES

(71) Applicants: Rahul Panat, Pullman, WA (US); Deuk Hyoun Heo, Pullman, WA (US)

(72) Inventors: Rahul Panat, Pullman, WA (US); Deuk Hyoun Heo, Pullman, WA (US)

(73) Assignee: WASHINGTON STATE UNIVERSITY, Pullman, WA (US)

( * ) Notice: Subject to any disclaimer, the term of this patent is extended or adjusted under 35 U.S.C. 154(b) by 420 days.

(21) Appl. No.: 14/964,635

(22) Filed: Dec. 10, 2015

(65) Prior Publication Data

US 2016/0172741 A1    Jun. 16, 2016

Related U.S. Application Data

(60) Provisional application No. 62/090,319, filed on Dec. 10, 2014.

(51) Int. Cl.
*H01P 11/00* (2006.01)
*B22F 3/105* (2006.01)
(Continued)

(52) U.S. Cl.
CPC .......... *B22F 3/1055* (2013.01); *B22F 1/0044* (2013.01); *B22F 7/08* (2013.01);
(Continued)

(58) Field of Classification Search
CPC ......... B33Y 10/00; B33Y 30/00; B33Y 80/00; B33Y 99/00; Y10T 29/49016;
(Continued)

(56) References Cited

U.S. PATENT DOCUMENTS 7,045,015 B2   5/2006   Renn et al.
7,674,671 B2   3/2010   Renn et al.
(Continued)

OTHER PUBLICATIONS

Nogi et al, "Foldable nanopaper antennas for origami electronics", Nanoscale, 2013, pp. 4395-4399, vol. 5, No. 10.
(Continued)

*Primary Examiner* — Peter DungBa Vo
*Assistant Examiner* — Joshua D Anderson
(74) *Attorney, Agent, or Firm* — Witham & Cook, P.C.

(57) ABSTRACT

Novel methods for micro-additive manufacturing three dimensional sub-millimeter components are disclosed herein. The methods can include dispensing a dielectric at positions on a substrate so as to provide dielectric structures having an aspect ratio of up to 1:20. The methods can also include in-situ curing of the dielectric structure upon dispensing of the dielectric wherein the dispensing and curing steps provide for three dimensional configurations. Direct printing a metal nanoparticle solution on the dielectric to create conductive traces and thereafter sintering the printed nanoparticle solution so as to cure the conductive traces enables three dimensional conductive (antenna) elements having a length and width scale of down to 1 μm.

12 Claims, 8 Drawing Sheets

(51) Int. Cl.
| | |
|---|---|
| *B22F 1/00* | (2006.01) |
| *G06F 1/16* | (2006.01) |
| *H01F 27/24* | (2006.01) |
| *H01F 27/28* | (2006.01) |
| *H01F 41/02* | (2006.01) |
| *H01F 41/04* | (2006.01) |
| *H05K 1/02* | (2006.01) |
| *H05K 1/03* | (2006.01) |
| *H05K 3/14* | (2006.01) |
| *H05K 3/22* | (2006.01) |
| *H05K 3/46* | (2006.01) |
| *B22F 7/08* | (2006.01) |
| *B29C 70/88* | (2006.01) |
| *B33Y 80/00* | (2015.01) |
| *H05K 1/09* | (2006.01) |
| *B33Y 10/00* | (2015.01) |
| *B33Y 50/02* | (2015.01) |
| *H01G 4/12* | (2006.01) |
| *H05K 3/12* | (2006.01) |

(52) U.S. Cl.
CPC ............ *B29C 70/882* (2013.01); *B33Y 80/00* (2014.12); *G06F 1/163* (2013.01); *H01F 27/24* (2013.01); *H01F 27/2804* (2013.01); *H01F 41/0206* (2013.01); *H01F 41/046* (2013.01); *H01P 11/001* (2013.01); *H05K 1/028* (2013.01); *H05K 1/0283* (2013.01); *H05K 1/0296* (2013.01); *H05K 1/0313* (2013.01); *H05K 1/0393* (2013.01); *H05K 1/09* (2013.01); *H05K 3/14* (2013.01); *H05K 3/22* (2013.01); *H05K 3/4644* (2013.01); *B22F 2003/1058* (2013.01); *B22F 2999/00* (2013.01); *B33Y 10/00* (2014.12); *B33Y 50/02* (2014.12); *H01G 4/1218* (2013.01); *H05K 1/0284* (2013.01); *H05K 1/097* (2013.01); *H05K 3/1241* (2013.01); *H05K 2201/0162* (2013.01); *H05K 2201/10098* (2013.01); *H05K 2203/0126* (2013.01); *Y10T 29/49016* (2015.01); *Y10T 29/49124* (2015.01); *Y10T 29/49155* (2015.01)

(58) Field of Classification Search
CPC ......... Y10T 29/49124; Y10T 29/49155; Y10T 29/49158; Y10T 29/4916; H05K 1/0284; H05K 1/0296; H05K 1/0313; H05K 1/09; H05K 1/092; H05K 1/095; H05K 1/097; H05K 1/119; H05K 3/0014; H05K 3/10; H05K 3/102; H05K 3/12; H05K 3/1241; H05K 3/125; H05K 3/1258; H05K 3/1283; H05K 3/14; H05K 3/207; H05K 3/22; H05K 3/227; H05K 2201/0267; H05K 2201/0373; H05K 2201/0915; H05K 2203/013; H05K 2203/0736; H05K 2203/0746; H05K 2203/1131; B21F 1/0018; B21F 1/0033; B21F 1/0037; B21F 1/0044; B21F 3/008; B21F 3/10; B21F 3/117; B21F 2203/1058
See application file for complete search history.

(56) References Cited

U.S. PATENT DOCUMENTS

| | | | |
|---|---|---|---|
| 2004/0197493 A1* | 10/2004 | Renn ................... | H01L 21/6715 427/596 |
| 2008/0052904 A1* | 3/2008 | Schneider ............ | H01L 21/486 29/846 |
| 2013/0342592 A1* | 12/2013 | Merz .................... | B41J 3/4073 347/2 |

OTHER PUBLICATIONS

Yao et al., "A novel tunable origami accordion antenna," Antennas and Propagation Society International Symposium (APSURSI), Jul. 2014, pp. 370-371.

Adams et al., "Conformal Printing of Electrically Small Antennas on Three-Dimensional Surfaces", Adv. Mater., 2011, pp. 1335-1340, vol. 23.

* cited by examiner

THREE DIMENSIONAL SUB-MM WAVELENGTH SUB-THZ FREQUENCY ANTENNAS ON FLEXIBLE AND UV-CURABLE DIELECTRIC USING PRINTED ELECTRONIC METAL TRACES

CROSS-REFERENCE TO RELATED APPLICATION(S)

The present application claims under 35 U.S.C. § 119, the priority benefit of U.S. Provisional Application No. 62/090,319, filed Dec. 10, 2014. The disclosure of the foregoing application is incorporated herein by reference in its entirety.

BACKGROUND OF THE INVENTION

Field of the Invention

The present disclosure relates to the fabrication of electrical components and circuits, and more particularly to a system and method for forming three dimensional sub-mm frequency antennas on flexible and in-situ cured dielectric material along with directly printed metallic antenna elements over the dielectric.

Discussion of the Related Art

The continual drive for smaller, more powerful, and more economical electronic systems led to the development of new manufacturing technologies. In particular, the fabrication of three-dimensional (3D) metal-dielectric structures at sub-mm length scale is highly important in order to realize low-loss passives and GHz wavelength antennas with applications in wearable and Internet-of-Things (IoT) devices.

To date, attempts to form sub-mm length scale 3D metal-dielectric structures include: (a) manufacturing metal lines in two-dimensions (2D) over a dielectric substrate and folding them into 3D shapes similar to an Origami, or (b) printing metal lines on a pre-manufactured 3D surface. The Origami folding of the substrate can result in 3D shapes only if the metal traces at the Origami folds are compliant enough to accommodate the extreme strain at or near the Origami folds. In addition, the number of 3D shapes are rather limited. Finally, the degree of folding of Origami is difficult to control due to the inherent structural instabilities and the nonlinear stress/strain response of these structures, leading to an unpredictable response over the operating frequencies in the case of its use in antennas. The approach in (b) suffers from the fact that the metal lines need to be stretched well beyond the yield/ultimate tensile strength of metals to reach the final shapes, requiring serpentine structures and thus increasing the device resistance. Direct write processes such as inkjet printing are also available for 2D fabrication of antenna structures. Inkjet printing is cheap and allows improved layout flexibility such as post-process deposition of thick dielectric layers and a relatively improved isolation from the substrate. Producing complex shapes or geometries along with traces, however, is difficult with inkjet printing at sub-mm length scale mainly because of the passive drop-on-demand nature of the inkjet process.

Thus, there is a need to provide for a novel micro-additive manufacturing method without removal of material to provide for structures at sub-mm length scales to be used as passives as well as antennas for wireless high-speed applications. The present embodiments are directed to such a need.

SUMMARY OF THE INVENTION

It is to be appreciated that the present example embodiments herein are directed to a method for manufacturing of a three dimensional sub-millimeter component, including: dispensing a dielectric on one or more positions on a substrate so as to provide one or more dielectric structures having an aspect ratio of up to 1:20; in-situ curing of the dielectric structure upon dispensing the dielectric at the one or more positions, wherein the in-situ curing coupled with the dispensing of the dielectric provides for three dimensional configurations; direct printing a metal nanoparticle-nanoparticle solution on the dielectric at the one or more positions to create one or more conductive traces; and sintering the printed nanoparticle-ink solution (hereby called a 'nanoparticle-solution' of 'nanoparticle ink') so as to cure the conductive traces to form three dimensional elements, wherein the three dimensional elements have a length and width scale of down to 1 µm.

Another aspect of the present application is directed to a method for micro-additive manufacturing of a three-dimensional wavelength antennas that includes: dispensing a dielectric on one or more positions on a substrate so as to provide one or more dielectric structures having an aspect ratio of up to 1:20; instantaneously curing in-situ the one or more dielectric structures upon dispensing the dielectric at the one or more positions, wherein the in-situ instantaneously curing coupled with the dispensing of the dielectric provides for three-dimensional configurations; direct printing a metal nanoparticle solution on the dielectric dispensed at the one or more positions so as to create one or more antenna traces; and directing energy toward the directly printed one or more created antenna traces for sintering so as to form one or more three-dimensional antenna elements, wherein the one or more three dimensional antenna elements have a length and width scale of down to 1 µm.

Another aspect of the present application is directed to a computing system having executable processor instructions for manufacturing of a three-dimensional antenna that includes: instructing a deposition head to dispense a dielectric on one or more positions on a substrate so as to provide one or more dielectric structures having an aspect ratio of up to 1:20; instructing an external energy source to in-situ instantaneously cure the one or more dielectric structures upon dispensing the dielectric at the one or more positions, wherein the in-situ instantaneously curing coupled with the dispensing of the dielectric provides for three-dimensional configurations; instructing a deposition head to direct print a metal nanopowder solution on the dielectric dispensed at the one or more positions so as to create one or more antenna traces; and instructing an energy source to direct energy toward the directly printed one or more created antenna traces for hardening after dispense and/or sintering after or immediately thereafter so as to form three-dimensional antenna elements, wherein the three dimensional antenna elements have a length and width scale of down to 1 µm.

Accordingly, the embodiments herein provide for three-dimensional passives and antenna structures on soft substrates that are beneficial to a host of internet-ready devices including wearable sensing, biometric and communication devices, implants, and chip-to-chip communication, etc. Flexible electronics with wireless sensing are at the heart of the emerging revolution in the 'Internet of Things' (IOT) that is predicted to usher areas of very high revenue streams for US corporations. Such embodiments herein thus can enable IOT and wireless sensors is to enable cost effective and versatile manufacturing processes for antennas that can be compacted with directional signal transmission.

BRIEF DESCRIPTION OF THE DRAWINGS

FIG. 7A shows

DETAILED DESCRIPTION

In the description of the invention herein, it is understood that a word appearing in the singular encompasses its plural counterpart, and a word appearing in the plural encompasses its singular counterpart, unless implicitly or explicitly understood or stated otherwise. Furthermore, it is understood that for any given component or embodiment described herein, any of the possible candidates or alternatives listed for that component may generally be used individually or in combination with one another, unless implicitly or explicitly understood or stated otherwise. It is to be noted that as used herein, the term "adjacent" does not require immediate adjacency. Moreover, it is to be appreciated that the figures, as shown herein, are not necessarily drawn to scale, wherein some of the elements may be drawn merely for clarity of the invention. Also, reference numerals may be repeated among the various figures to show corresponding or analogous elements. Additionally, it will be understood that any list of such candidates or alternatives is merely illustrative, not limiting, unless implicitly or explicitly understood or stated otherwise.

In addition, unless otherwise indicated, numbers expressing quantities of ingredients, constituents, reaction conditions and so forth used in the specification and claims are to be understood as being modified by the term "about."

Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical values, however, inherently contain certain errors necessarily resulting from the standard deviation found in their respective testing measurements.

It is also to be appreciated that while UV curable dielectrics (e.g., Acrylate Urethane) are disclosed as part of the process material in creating the novel 3D structures of the present application, the term "dielectric" (dielectric material), as used herein, refers to any material to be used herein that is not electrically conducting. The material may be either organic or inorganic. Organic examples include polymers, such as, for example fluorinated polymer, polyimide, epoxy resins, acrylic resins, polyalkylene resins, polyurethane resins and other conventional polymers known and understood to those of ordinary skill in the art. It is also to be noted that that the dielectric permittivity can be easily modulated by mixing it with high permittivity particles prior to deposition. Such functionally graded dielectric materials can help control the electrical characteristics of antennas, interconnects, and other structures such as RF structures, as disclosed herein. Moreover, during in-situ dielectric curing, UV intensity variations with the dielectric dispense can be utilized to aid in creating functionally graded dielectrics. Also, reinforcing material for enhancing the dimensional stability of the material such as glass or quartz fibers, carbon fibers, ceramic fibers, polymer fibers, glass powder, quartz powder, ceramic powder and paper is equally capable of being utilized. The dielectric can also include ceramics.

A "precursor," as utilized herein, is a chemical formulation often comprising a solute or solutes dissolved in a desired solvent. The system may also contain additives that alter properties of the solution. "Inks," as utilized herein, are desired particles to include metal nanoparticles or metal nanoparticles of an electronic material suspended in a fluid medium. While a preferred material to create the conductive element of 3D antenna-like structures includes a silver nanoparticle ink, other introduced materials to enable desired disclosed antenna and passive structures include, but are not limited to, silver, carbon, copper, gold, platinum, aluminum, and palladium. It is also to be noted that in some embodiments, the conducting elements of the ink a capable of being a conductive polymer. It is also to be appreciated that the additive deposition embodiments herein can often include one or more carrier gas sources, such as compressed air, argon or nitrogen, configured to deliver the precursor materials to the deposition environment. Depositable pastes can also be utilized and include, but are not limited to, commercially available paste formulations for conductive, resistive, dielectric, and inductive systems.

The term "three-dimensional structure" as used herein refers to structures that include, but are not strictly limited to: circular, rectangular, convex, concave, or any suitable shape including that of a variable cross section required for the antenna structures disclosed herein. Moreover, the embodiments herein having such three-dimensional structures also includes passive components, to include smooth wall passive components such as waveguides, up and down tapers, horn antennas, cavities and mirrors, and photonic band-like structures. It is also to be appreciated that "passive structures," as utilized herein, also include a structure having a desired electrical, magnetic, or other property, including but not limited to a conductor, resistor, capacitor, inductor, insulator, dielectric, suppressor, filter, varistor, ferromagnet, adhesive, and the like.

As used herein, the term "additive deposition" generally refers to a process wherein portions or layers of materials are deposited and/or formed accumulatively and without subtractive removal of the material.

Moreover, while the substrate materials (base) often are silicon substrates, other materials, such as, for example, silicon nitride; glass; germanium, aluminum antimonide, indium tin oxide (ITO); ITO-coated glass; and polymers (e.g., polyethylene naphthalate (PEN), polyetherimides, polyamide and polyamide-imides; and combinations thereof), can also be utilized as substrate materials without departing from the scope of the embodiments herein.

Thus, and as disclosed herein, the micro-additive manufacturing (MAM) techniques herein can be utilized to produce passive components and three-dimensional sub-mm wavelength sub-THz frequency antennas by way of micro-additive manufacturing.

General Description

Micro-additive manufacturing has emerged as an environmentally friendly method of fabricating 3D electronic structures. The process itself utilizes atomized materials (inks) to produce femtoliter-sized droplets that are directed onto a base material via the aid of a focused sheath gas. The system herein uses a similar but novel method to provide, as an illustrative example, average pillar heights of about 1.2 mm, pillar diameters of about 1 mm, wall thicknesses of about 58.5±2.5 µm and conductive trace features down to about 10 µm with line widths of up to about 200 µm. Such additive fabrication has beneficial aspects since no material is wasted (i.e., it is not a subtractive method) and the micro-additive manufacturing methods herein do not require the use of harmful chemicals as is the case for lithography or MEMS based techniques.

As a general insight into the present embodiments herein, the manufacturing processes of the present application utilize in situ curing of a dispensed dielectric material at the micro-scale followed by direct write of metal nanoparticle inks on vertical as well as horizontal walls (using the angularly dispose deposition head of to provide angles from the vertical from 0 up to 89 degrees) of a dielectric using a tilted nozzle deposition head. Moreover, the micro-additive manufacturing system herein is also capable of printing materials directly onto a base substrate (e.g., silicon).

It is also to be appreciated that the method(s) herein is/are capable of a standoff height (clearance) of up to 5 mm. As a result, printing on complex 3D surfaces is easily facilitated to enable the fabrication of novel structures, such as the three dimensional sub-mm wavelength antenna-like structures to be described below. Other dispense methods such as inkjet printing or needle based injection can also be used to create the dispense the precursor for the dielectric and the conductive elements of the antenna. Such three dimensional sub-mm wavelength antennas have applications to include wearable flexible electronics as well as ultra-high speed chip-to-chip communication. Such unique methods of manufacture, as disclosed herein, thus make it possible to provide reliable antenna designs with three dimensional geometries to include curved geometries (concave, convex, etc.) that provide substantial area/volume compaction and directionality to the signal propagation.

Accordingly, the present embodiments herein generally comprise a manufacturing method to create, for example, three dimensional sub-mm wavelength (<1 mm) sub-THz (<1000 GHz) frequency antennas on flexible and in-situ cured dielectric material along with directly printed conductive antenna elements over the dielectric.

Specific Description

Figure 1:
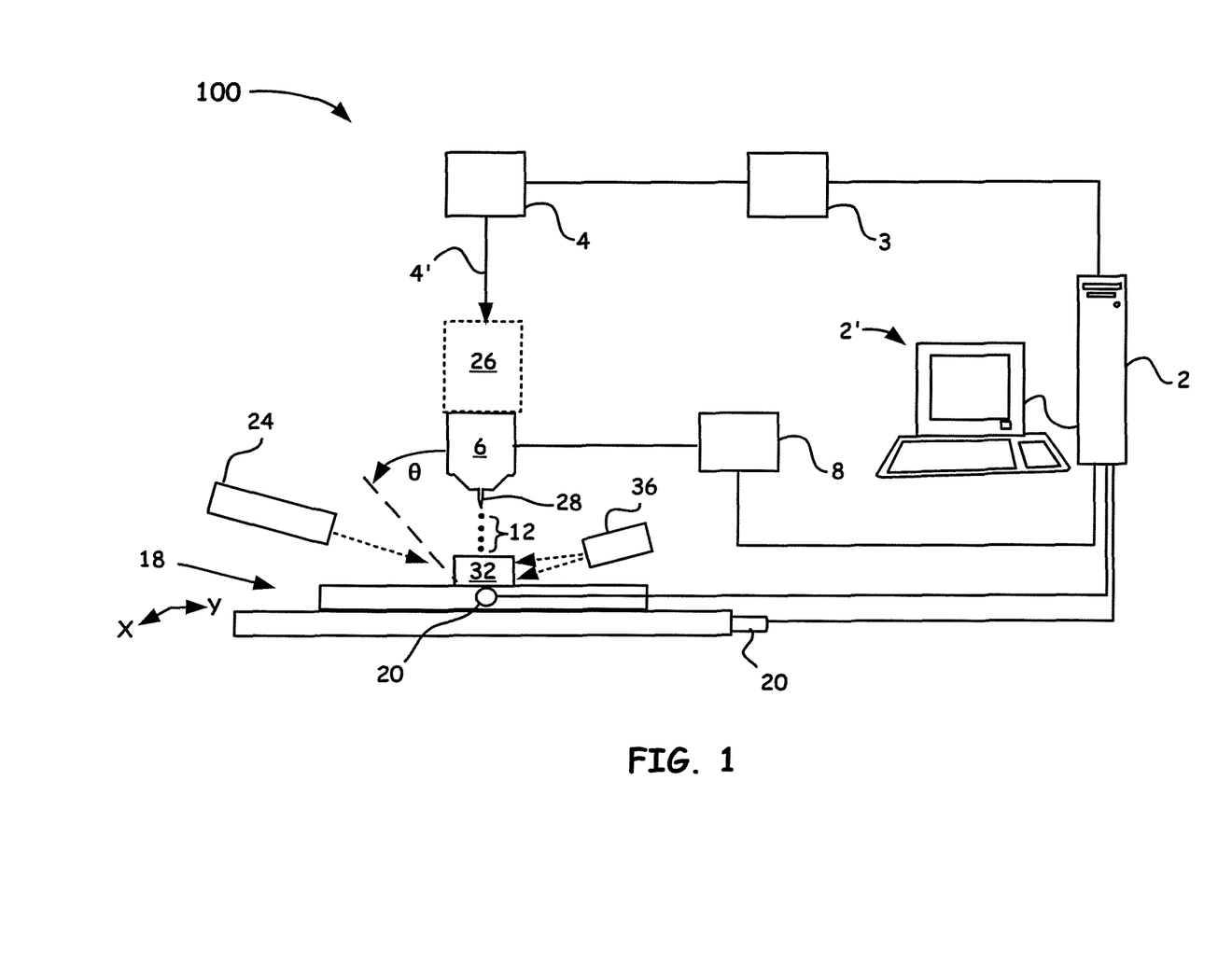
FIG. 1 shows an example general depiction of a micro-additive deposition system, such as an inkjet, or an aerosol jet, or other dispense system, as disclosed herein.

Turning now to the drawings, FIG. 1 illustrates a general non-exhaustive example diagram of an micro-additive deposition system 100, in accordance with the embodiments herein. As shown in FIG. 1, the micro-additive deposition system 100 includes a controller 2 (e.g., a computer/processor), a carrier gas regulator 3 shown coupled to one or more atomizer/nebulizers 4 (e.g., ultrasonic atomizer and/or a pneumatic nebulizers) to aid in directing an atomized aerosol flow 4' (also denoted with a directional arrow) ultimately to one or more maneuverable deposition heads 6, often two or four deposition heads (only one shown for simplicity). Also shown in FIG. 1 is a sheath gas regulator 8 coupled to the deposition head 6 so as to aid in focusing deposition materials 12 onto a substrate 14 base material, a programmable XY motion stage 18, (also can be configured as an XYZ motion stage), stage actuators 20 shown coupled to controller 2 to provide accuracies of ±6 µm, and an energy source 24, such as, for example, a microwave source, a pulsed photonic source (e.g., a Xenon flash lamp), or more often a laser source, such as, for example, an Infrared Laser source (e.g., a 700 mW, 830 nm IR laser source) configured to direct energy (shown as a dashed arrowed line) to desired structures deposited on the substrate 32 for sintering (e.g., antenna traces) the dispense after or immediately thereafter or curing (e.g., the dielectric).

The micro-additive deposition system 100 also includes curing capabilities, often in-situ curing, for deposited 3D structured dielectrics, wherein the curing process may involve the application of heat, often a UV light source attachment 36 to provide the radiation, such as, but not limited to, a UV arc lamp, more often a UV Spot Curing attachment that utilizes LED technology (radiation shown as a pair of dashed arrowed lines for illustrative purposes). It is also to be noted, as previously stated above, that the UV intensity from a UV light source attachment 36 can be varied with a dielectric dispensed material in order to create a graded dielectric over which a metal nanoparticles can be dispensed.

The dashed box 26 in FIG. 1 is shown for simplicity to denote other components that can be incorporated with the micro-additive deposition system 100, such as, but not limited to, virtual impactors, exhaust manifolds, heating modules (e.g., to evaporate aerosol flow 4'), etc. It is to be noted that the deposition head 6 is often configured with a needle-like configuration or other suitably configured dispenser 28 so as to dispense a small amount of droplets (e.g., 1-5 µm-sized droplets), beads, or other forms of additive aerosol jetted material known to those of ordinary skill in the art onto a desired base substrate 32 material. It is also to be noted that because the deposition head(s) 6 are maneuverable, such a configuration enables dispensing high volumes of material in different orientations, such as, for example to provide angles from 0 up to 89 degrees (denoted by (θ) in FIG. 1) orientation from the vertical. It is to also be appreciated that while particular components are used to illustrate the micro-additive deposition system 100, as shown in FIG. 1, system 100 can also include additional and/or different components and/or configurations, such as, for example, substrate heating configurations, a desired number of additional gas-line arrangements, etc.

It to be noted that the operation of components within the micro-additive deposition system 100 can be enabled by a controller 2 and data system of various circuitry of a known type. The controller 2 itself can include a processor (not shown) coupled to a memory (not shown) and an input/output component (e.g., as denoted by the reference character 2'). The processor can include a microprocessor, a field-programmable gate array, and/or other suitable logic devices. The memory can include volatile and/or nonvolatile computer readable media (e.g., ROM; RAM, magnetic disk storage media; optical storage media; flash memory devices, EEPROM, and/or other suitable non-transitory storage media) configured to store data received from, as well as instructions for, the processor.

As an example configuration, the data and instructions are stored in a computer readable medium. Alternatively, the data may be stored in one medium (e.g., RAM), and the instructions may be stored in a different medium (e.g., EEPROM). In operation, the processor can execute the instructions stored in the memory to perform a process, such as the process to produce the structures discussed below with reference to FIGS. 5A-5E and FIGS. 6A-6D. An input/output component 2' can include a display, a touch screen, a keyboard, a track ball, a gauge or dial, and/or other suitable types of input/output devices.

The controller 2 can, as an example, be operatively coupled to the other components, such as, a wireless network configured with Bluetooth, which operates in a globally available frequency band (i.e., 2.4 GHz), ensuring communication compatibility worldwide, or the wireless network can be Electronic and Electrical Engineers IEEE technologies (e.g., (IEEE) 802.11a or IEEE 802.11b) as the communication means based on its present common use in both business and home environments. Such popular technologies enable users' high-speed access to networks and the Internet. Moreover, other protocols for wireless, such as IEEE 802.15, IEEE 802.16, GPS, 3G and others, may also be configured as a protocol for the communication standard of the present embodiments disclosed herein. Data can also be transferred seamlessly to a PC or Network via, for example a USB port or Wi-Fi for electronic archiving or printing. As another beneficial embodiment, an external keyboard (generally shown as denoted by 2') or mouse can also be coupled to the micro-additive deposition system 100 via, for example, Bluetooth® if even greater flexibility is desired.

With respect to a physically wired coupling aspect, the coupling can be by way of a dedicated coupling I/O means, such as an Ethernet cable or the aforementioned USB port to provide, for example, operational data transfer via an embedded software (e.g., the firmware) an application specific integrated circuit, a system-on-chip circuit, a programmable logic controller, and/or other suitable computing frameworks in the micro-additive deposition system 100 or instructions received from, in some operations, a coupled processor or aforementioned wireless connectivity.

It is to be noted that the micro-additive deposition system 100 embodiments disclosed herein can also incorporate individual software modules, components, and routines in the form of a computer program, procedure, or process written as source code in C, C#, C++, Java, and/or other suitable programming languages. The computer programs, procedures, or processes may be compiled into intermediate, object or machine code and presented for execution by any of the example suitable computing devices discussed above. Various implementations of the source, intermediate, and/or object code and associated data may be stored in one or more computer readable storage media that include read-only memory, random-access memory, magnetic disk storage media, optical storage media, flash memory devices, and/or other suitable media.

A computer-readable storage medium, in accordance with aspects of the present invention, refers to media known and understood by those of ordinary skill in the art, which have encoded information provided in a form that can be read (i.e., scanned/sensed) by a machine/computer/processor and interpreted by the machine's/computer's/processor's hardware and/or software. It is also to be appreciated that as used herein, the term "computer readable storage medium" excludes propagated signals, per se.

In operation, the controller 2 can receive a desired design file for a target structure, product, or article of manufacture, for example, in the form of a computer aided design ("CAD") file or other suitable types of file. The design file can also specify at least one of a composition, a structural profile, a structural dimension, or other desired properties of the structure. The controller 2 can thereafter analyze the design file and generate a recipe having a sequence of operations to form the structure via reactive deposition in layer-by-layer, section-by-section, or other suitable accumulative fashion.

As a general illustration of operation of the micro-additive deposition system 100, direct dispensing at a length scale of tens of micrometer by system 100 of a desired dielectric (e.g., at 300 cP) material onto a substrate 32 (e.g., a silicon chip) is first provided under computer controller's 2 direction to create the initial dielectric 3D structures. The source materials can be monomers, solutions, suspensions, or any combination of these and as stated above, are often polymers, such as a UV curable polyurethane or a UV curable epoxy.

Thus, a desired dielectric is placed in, for example, the ultrasonic/pneumatic atomizer 4, which creates a vapor that is transferred to the deposition head 6. The deposition head is capable of being tilted to provide angles from 0 up to 89 degrees (θ) from the vertical when depositing so as to aid in forming 3D structures. To aid in delivering the dielectric vapor to the deposition head 6, carrier gas regulator 3, as directed by controller 2, provides the desired gas flow rate so as to run through the ultrasonic atomizer and/or a pneumatic nebulizer 4 towards the deposition head. The carrier gas itself may comprise compressed air or an inert gas. To create the spatial variations/structures, the substrate 32 is moved under the aforementioned computer control by utilizing the XY stage 18 actuators 20 and the amount of the dielectric is dispensed in varying amounts if desired to provide varying permittivity.

In particular, the substrate 32 (or an alternate target) can move while the dielectric is being dispensed in two orthogonal directions under computer control of the XY stage 18 actuators 2 so that intricate geometries may be deposited. Alternatively, the deposition head 6 can move angularly while maintaining substrate 32 (or an alternate target) in a fixed position. Another arrangement allows for movement of deposition head 6 angularly while the substrate 32 (or an alternate target) moves in a direction orthogonal to that of deposition head 6.

As a beneficial aspect, upon creating the 3D structure (e.g., a cylinder), the structure is in-situ cured using the UV light from UV source 36. Using system 100 thus allows the fabrication of dielectric substrates of various shapes with extremely high aspect ratios of, for example, up to 1:20.

Thereafter, a desired nanoparticle ink is placed in the ultrasonic/pneumatic atomizer 4, which creates a dense vapor of the ink with droplet sizes of about 1-5 µm that is transferred to the deposition head 6. The deposition head, in addition to dispensing dielectric material at various angles, is more often capable of being tilted to provide angles from 0 up to 89 degrees (θ) from the vertical when depositing the nanoparticle traces so as to form, for example, metal lines to enable the novel designs herein. Again, the substrate 32/dielectric structures are moved under the aforementioned computer control by utilizing the XY stage 18 actuators 20, as similarly described above, so as to also enable spatial structures to be formed.

To aid in delivering the dense nanoparticle ink vapor to the deposition head 6, carrier gas regulator 3, as directed by controller 2, provides the desired gas flow rate so as to run through the ultrasonic atomizer and/or a pneumatic nebulizer 4 towards the deposition head. The carrier gas itself may comprise compressed air, an inert gas (which may comprise a solvent vapor), or a mixture of both.

If system 100, as generally shown in FIG. 1, utilizes an atomizer, the dense vapor of the ink or dielectric often enters the deposition head immediately after the atomization process. If system 100 utilizes a nebulizer, such a process initially requires a gas flow rate that is greater than is acceptable for the deposition head 6. To overcome such a flow rate, a virtual impactor 26, as understood by those of ordinary skill in the art, is often utilized to reduce the flow rate through deposition head 6 of the carrier gas without any deleterious loss of droplets or particles.

In either process, the dense vapor mist stream is then focused by a secondary gas flow, by way of, for example, the sheath gas regulator 8 as directed by controller 2 to form the micro jet of particles 12. The sheath gas itself is utilized to form a boundary layer that both focuses the desired carrier stream and also minimize clogging of particles in the dispenser 28 nozzle orifice. Since the aerosol stream is focused by the sheath gas stream, the width of deposited material is only a fraction of the width of the nozzle tip, often a tenth of the width. It is to be reiterated again that the distance between tip and target (e.g., substrate 32) surface can vary up to about 5 millimeters (mm) and the dispensing head 6 can vary angularly from 0 up to 89 degrees (θ) so as to make it suitable technology for uneven (e.g. curved) surfaces. Moreover, the diameter of the emerging mist stream (and therefore the linewidth of deposited material) is often controlled by the dispenser 28 nozzle orifice size, the ratio of sheath gas flow rate to carrier gas flow rate, exhaust pressure, and the spacing (stand-off distance) between the dispenser 28 nozzle orifice and target (e.g., substrate 32). The optimized parameters such as sheath gas pressure, atomizing pressure and exhaust pressure may vary for different inks based upon their viscosity, particle size and the solvent used.

Simulations

Figure 2:
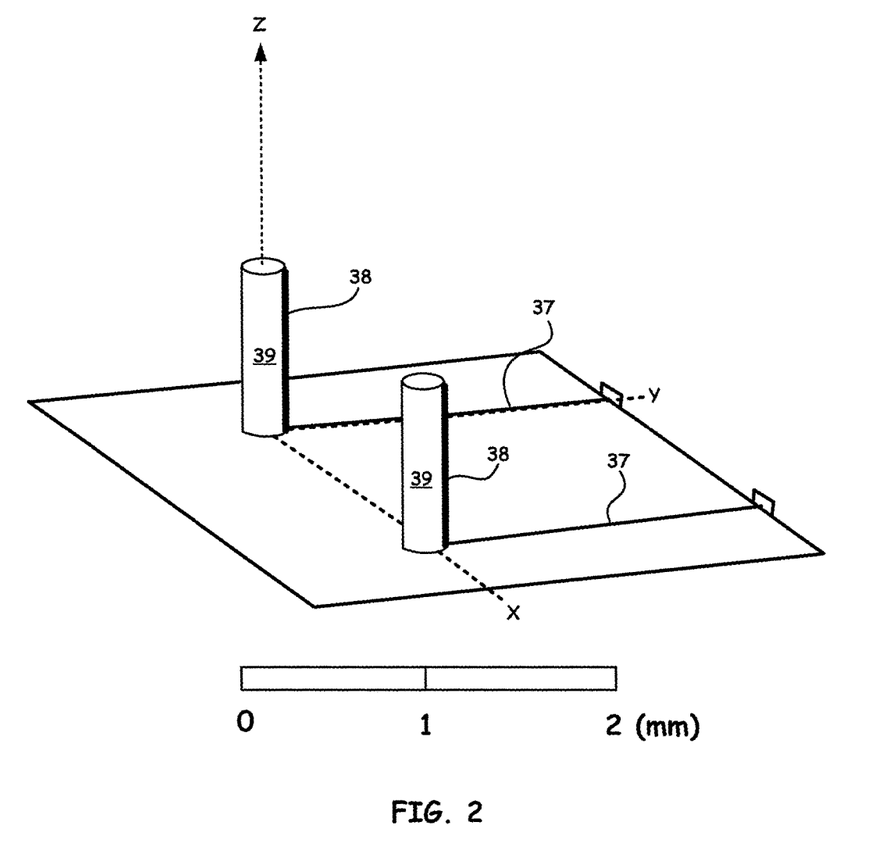
FIG. 2 shows a 60 GHz 2-element monopole array used for simulations.

Simulations can be utilized herein to first establish microstructures that can act as mm wave antennas in 3D with superior directivity and gain. Electrical simulations can be performed using a desired commercial software. FIG. 2 thus shows that for the model, micro-strip transmission lines 37 are used to feed two resonant quarter-wave monopole antennas 38 printed onto dielectric support pillars 39. The antennas 38 are designed for input resonance around 60 GHz, and produce a directional gain pattern through the formation of an on-chip antenna array.

The relative permittivity of a desired dielectric is taken as 4.023 (from Loctite 3105 data sheet, Henkel Inc.), used in the fabrication, while the loss tangent is at 0.031. The resistivity of the metal lines is taken to be $9 \times 10^{-8}$ Ωm. It is to be noted that the gain is a key performance figure which describes an antenna's directivity. The design of such a system, though trivial in apparent complexity, is unavailable to designers with existing fabrication technologies. The example structure proposed for use in the wireless system of FIG. 2 currently fits within a 4 mm by 2 mm footprint, as shown by the scaled indicator.

Figure 3A:
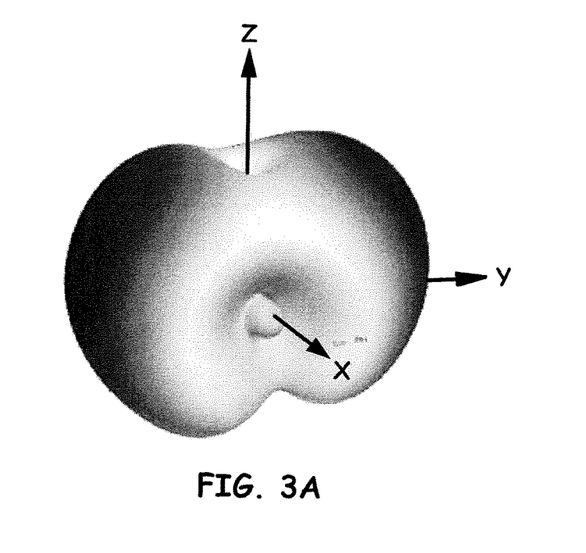
FIG. 3A shows full radiation pattern assuming far field operation with an antenna placed at the origin.
Figure 3B:
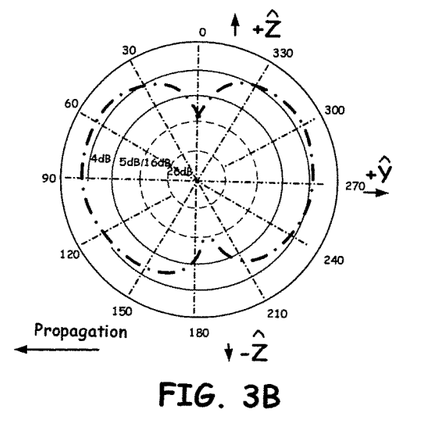
FIG. 3B shows the gain pattern along the XY-plane corresponding to energy radiated towards other structures placed on the same plane.
Figure 3C:
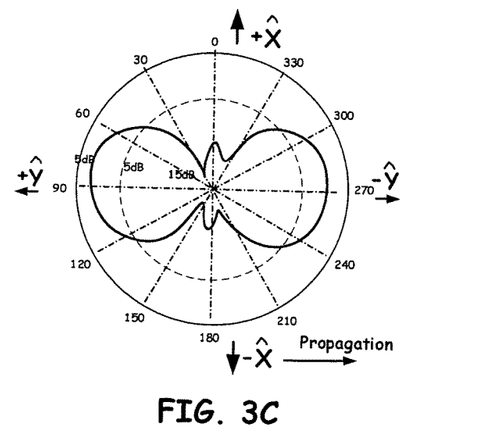
FIG. 3C shows gain versus elevation angle, looking in the forward ($\phi$=90° or -ŷ) direction.

FIG. 3A, FIG. 3B, and FIG. 3C show the gain pattern of the antenna system in various directions. Higher gains indicate directions where the signal is radiated out with higher relative power to a mathematically ideal uniform isotropic radiator. FIG. 3A shows full radiation pattern assuming far field operation with an antenna placed at the origin. FIG. 3B shows the gain pattern along the XY-plane corresponding to energy radiated towards other structures placed on the same plane. FIG. 3C shows gain versus elevation angle, looking in the forward ($\phi=90°$ or $-\hat{y}$) direction. The 0° and 180° corresponds to radiation vertically into the substrate below the antennas and air directly above the antennas, respectively; while 90° corresponds to the desired direction to another antenna.

Figure 4:
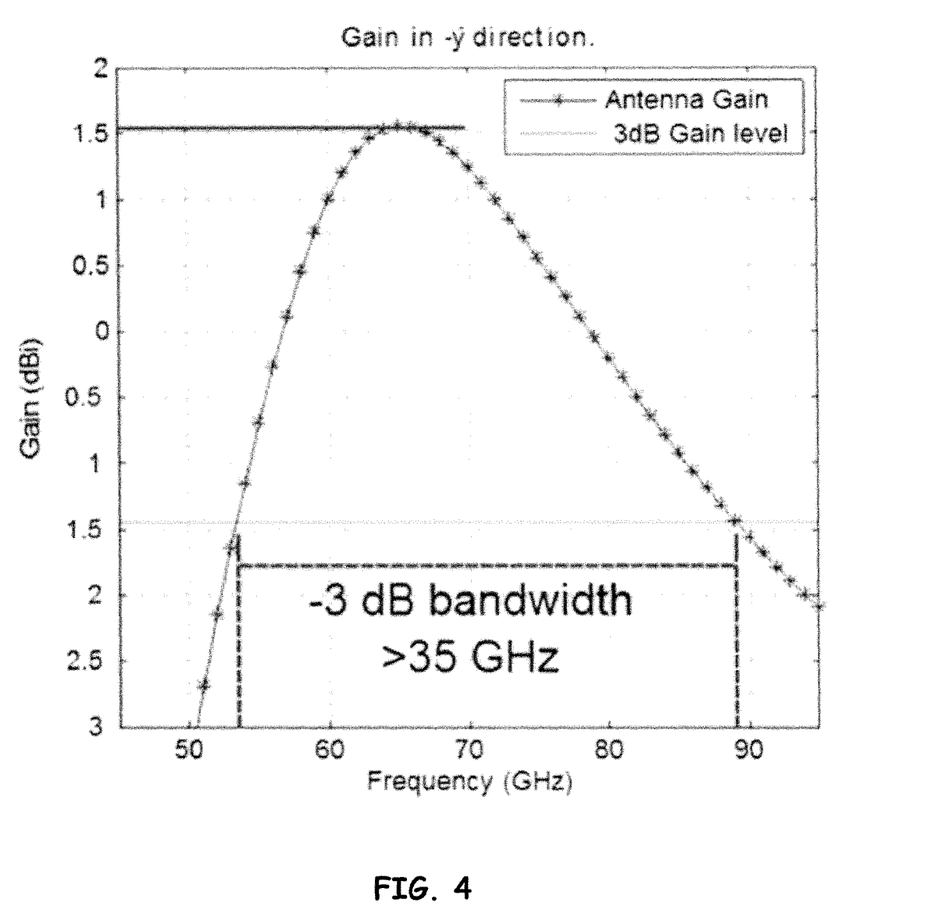
FIG. 4 shows the gain in the $\theta$=90° $\phi$=270° (or equivalently-ŷ) direction as the input frequency is varied for the microstructure shown in FIG. 2.

FIG. 4 shows the gain in the $\theta=90°$ $\phi=270°$ (or equivalently-$\hat{y}$) direction as the input frequency is varied for the microstructure shown in FIG. 2. The marked points at −1.5 dB show the frequencies at which the antenna's radiated power is half that of the peak output shown at 65 GHz. As modulation produces a bandwidth at RF frequencies equivalent to the frequency content of a baseband signal, wide bandwidth of RF radiation structures are required to prevent distortion and a consequent increase in bit-error rate of high speed signals. FIG. 4 thus shows that the system achieves a usable gain of roughly 1.5 dBi while providing a −3 dB bandwidth in excess of 35 GHz, targeted for 60 GHz. The simulation results indicate the benefits brought by moving the antenna off of top interconnect metal such that it is effective at RF bandwidth beyond the capabilities of the current state-of-the-art 2D antennas.

The present invention will be more fully understood by reference to the following examples, which are intended to be illustrative of the present invention, but not limiting thereof.

EXAMPLES

Beneficial Example Materials

The primary material sets used to create 3D antenna-like structures exemplified in FIGS. 5A-5E and FIGS. 6A-6D include a metallic nanoparticle ink and a UV curable dielectric. Silver nanoparticle ink is desirably used (Advanced Nano Particle Inc., Fremont, Calif., AS1:2), while the dielectric material used is a UV curable Acrylic Urethane (Loctite 3105, Henkel Inc.). The size of the metal nanoparticles had about 50 wt %±5% particle loading with particle size of 50-100 nm with a viscosity of about 160 cP at 0.4 rpm. The dielectric material has a viscosity of 300 cP. A minimum nanoparticle curing regimen was applied at 130° C./2 h. The resistivity measured in these conditions is about $9 \times 10^{-8}$ Ωm or about 20% of the bulk silver (Optomec data sheet). Glass and a functional Si chip were used as the substrate. The substrates were cleaned with DI water followed by isopropyl alcohol. An atmospheric plasma at 100 W for 1 min was then applied to the substrate to improve the uniformity of the printed patterns. Before printing the structures, ink material can be rolled in on a roller (SCILOGEX MX-T6-S Analog Tube Roller) for 24 hours to minimize particle agglomeration per the manufacturer guidelines.

Beneficial Example Manufacturing Process/Configurations

The dispenser 6 nozzle orifice exit diameter to create desired polymer dielectric posts is often 200 µm, and about 150 µm for printed nanoparticle lines (i.e., silver lines). Such an arrangement is understood to vary upon design considerations as a minimum line width is often about 10 times smaller than the nozzle diameter based upon the parameters discussed above. The dielectric printing used a pneumatic atomizer 4 with an air pressure of 3 psi and a sheath gas pressure of 0.13 psi. The dielectric material is dispensed using the micro-additive deposition system 100 at 10-100 µm length scales and instantaneously cured using the UV light source attachment to build complex 3D shapes at a length scale of less than 1.5 millimeters (mm), often less than 1 mm. A virtual impactor is also utilized to concentrate the aerosol in-between the atomizer and print head (dispenser 6).

As a beneficial method, a silver nanoparticle ink is utilized with an ultrasonic atomizer 4 with a gas pressure of 0.25 psi, and a sheath gas pressure of 0.25 psi. The sheath air pressure for the silver printing is higher than that for the polymer printing because of the smaller nozzle diameter (150 µm versus 200 µm). The standoff distance between the chip (substrate 32) and the dispenser tip 28 is desired to be about 5 mm.

As similarly stated above, the overspray and hence the printing quality (e.g., linewidths) can depend upon (a) the standoff distance (lower overspray for lower standoff distance), (b) ratio of sheath gas pressure to the atomizing pressure for the ultrasonic atomizer, and (c) the combination of sheath gas pressure, atomizing pressure and exhaust pressure for the pneumatic atomizer. The process parameters are thus optimized for the nanoparticle ink and the 3D structures to be manufactured.

FIGS. 5A-5E and FIGS. 6A-6D show the fabricated antenna structures directly over a substrate using novel methods disclosed herein. As shown in the schematic illustration in FIG. 5A, a dielectric cylinder 42 is created on a substrate 32 by dispensing a UV curable dielectric 40, such as, for example, an Acrylate Urethane from the deposition head 6 followed by its instantaneous curing using the UV light attachment 36. Such an arrangement allows the fabrication of dielectric substrates with extremely high aspect ratios (up to 1:20), as previously stated.

Figure 5A:
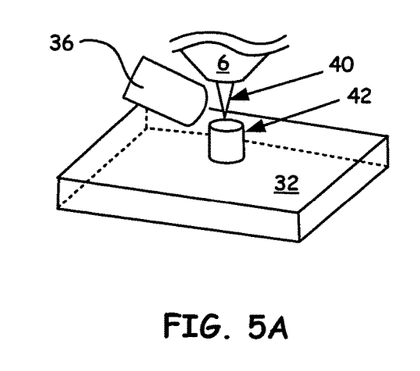
FIG. 5A shows a sub-mm length scale schematic of a 3D metal-dielectric pillar being configured.
Figure 5B:
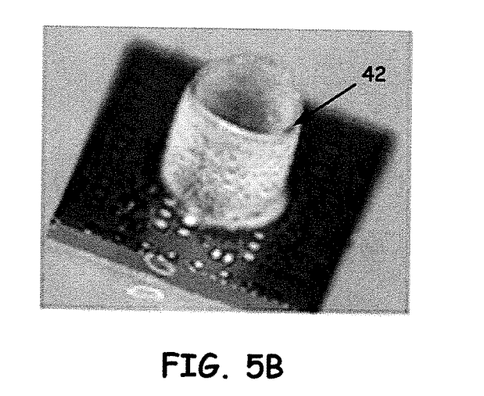
FIG. 5B shows an image of an instantaneously cured dielectric pillar.
Figure 5C:
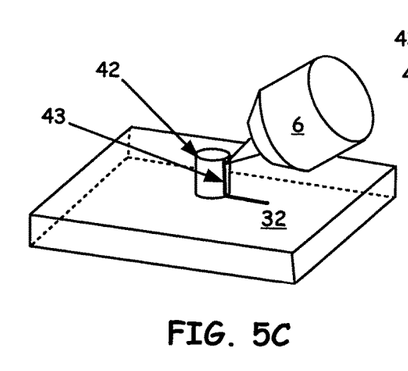
FIG. 5C shows a schematic of the process to write novel lines disclosed herein.
Figure 5D:
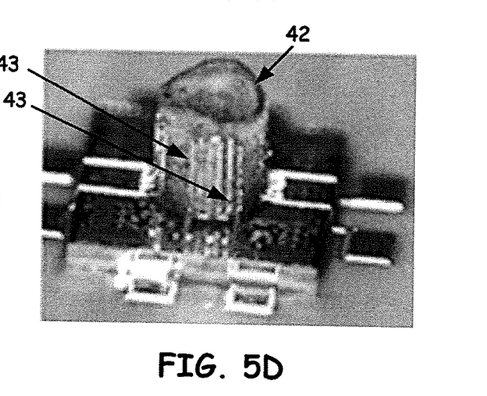
FIG. 5D shows an image of the vertical metal lines onto the wall of the dielectric pillar.
Figure 5E:
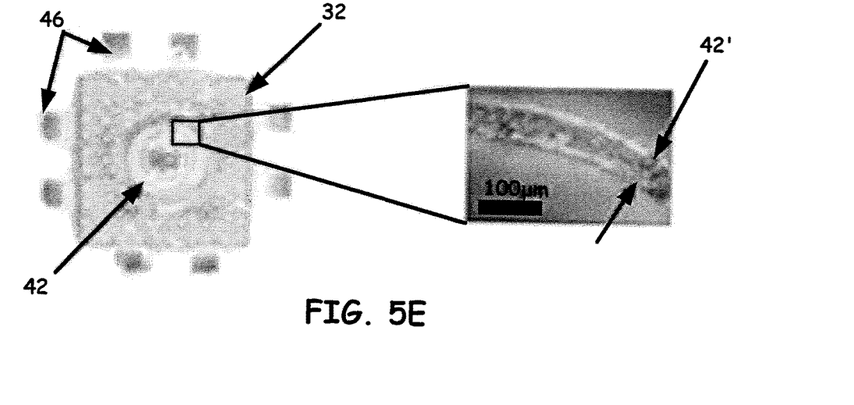
FIG. 5E shows a top-down image of the cylinder images shown in FIG. B and FIG. D.

FIG. 5B shows an actual resultant fabricated hollow dielectric cylinder structure 42. For such structures, the average pillar height is about 1.2 mm, the pillar diameter is about 1 mm, while the wall thickness is about 58.5±2.5 µm. The tilted head of the micro-additive deposition system 100 used to deposit one or more metal lines 43 is also schematically shown in FIG. 5C. A resultant actual image of the dispensed metal lines 43 (two denoted for simplicity) on the hollow cylinder 42 structure are shown in FIG. 5D. Beneficial metallic interconnects are approximately 22 µm in width. After printing the structure, the nanoparticle traces are often thermally sintered. As previously stated, the dielectric permittivity can be easily modulated by mixing it with high permittivity particles prior to deposition. FIG. 5E shows a top-down image of the cylinder images shown in FIG. B and FIG. D. The left portion of FIG. 5E illustrates the hollow constructed cylinder 42 and pads 46 on a substrate (e.g., a silicon chip). The right portion of FIG. 5E shows a magnified view of the wall width 42' with a scale length for perspective of the hollow cylinder 42 shown to the left in FIG. 5E.

Figure 6A:
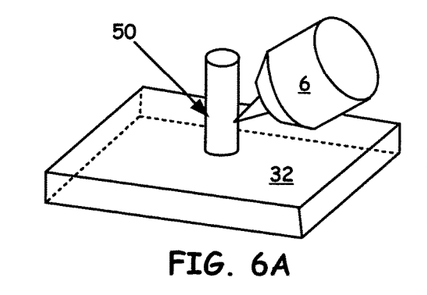
FIG. 6A shows a schematic of an appropriate dispense based micro-additive manufacturing process to create a solid micro-manufactured monopole structure.

FIG. 6A shows a schematic of the micro-additive manufacturing process to create a monopole pillar 50 structure (here the dielectric portion). Additional antenna elements were also fabricated using the same micro-additive fabrication method. FIG. 6A thus shows an antenna-like monopole dielectric pillar 50 structure dispensed from an angularly positioned deposition head 6 to provide a structure with a high aspect ratio over a glass substrate 32 (similar to that shown in FIG. 2).

Figure 6B:
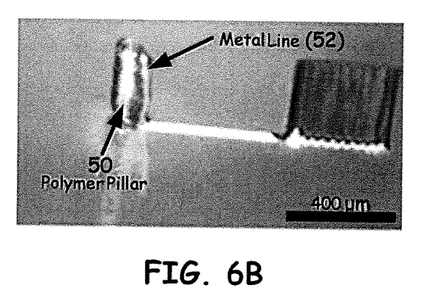
FIG. 6B shows an image of a fabricated 75 μm dielectric polymer pillar structure and about a 22 μm metal trace.
Figure 6C:
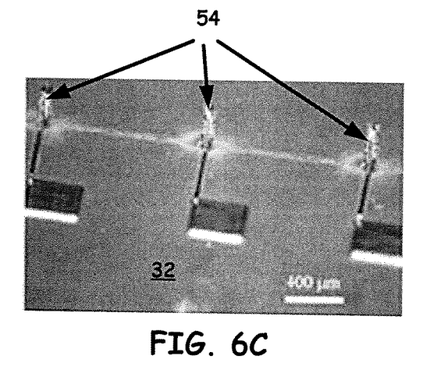
FIG. 6C shows a plurality of fabricated micro-monopole structures on a substrate.
Figure 6D:
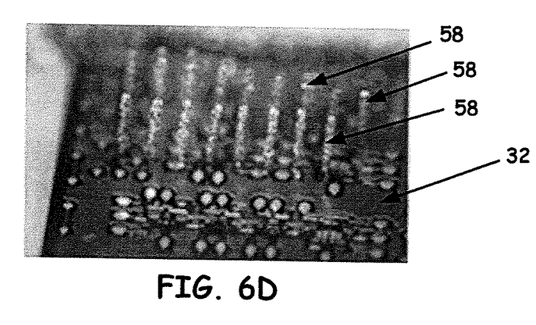
FIG. 6D shows periodic dielectric pillars directly fabricated over a Silicon chip.

FIG. 6B shows a fabricated 75 µm dielectric polymer pillar 50 structure and a 22 µm metal trace 52 (the pad dimension in these perspective images is 400 µm). FIG. 6C shows a plurality of such monopole 54 structures on a substrate 32. FIG. 6D shows a plurality of periodic dielectric pillars (3 denoted for simplicity) directly fabricated over a Si chip (i.e., a silicon chip operating as a substrate 32). Such FIGS. 6A-6D thus demonstrate the novel manufacturing method capable of fabricating 3D antenna-like structures at sub-mm length scales.

Figure 7A:
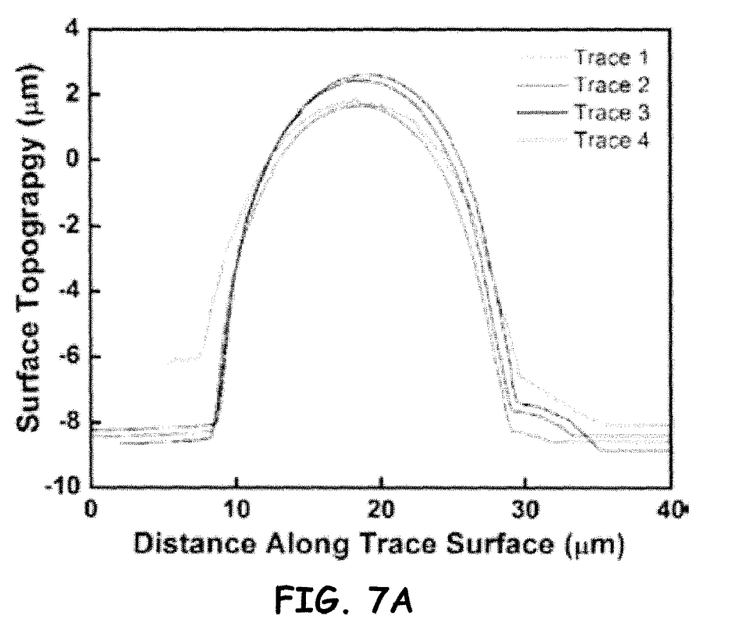
FIG. 7A shows the actual metallic trace surface profile shown in FIG. 6B.
Figure 7B:
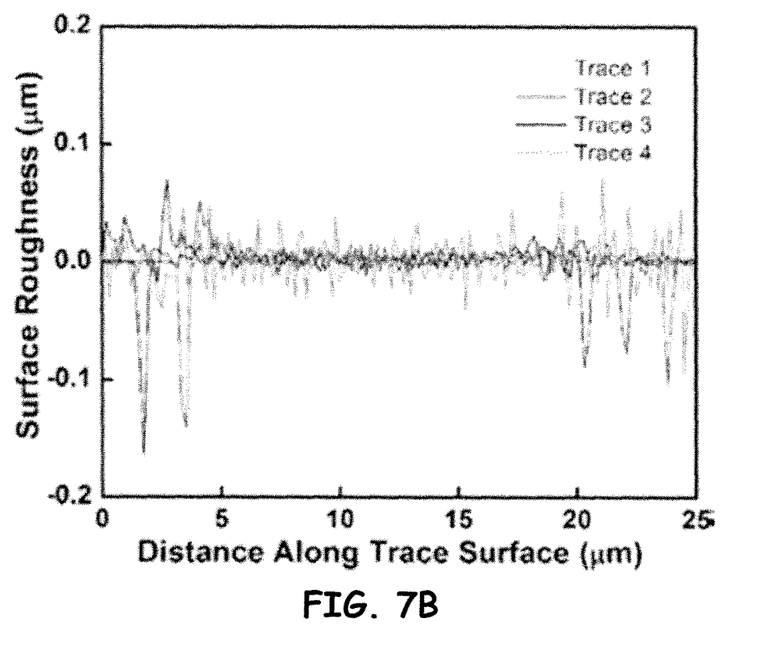
FIG. 7B shows the same profiles as in FIG. 7A after the moving average has been subtracted from the profile to get a roughness estimate.

The metal nanoparticles printed and sintered on the dielectric as shown in the images discussed above have been characterized for roughness using profilometry. The surface roughness is highly important at high frequencies to determine the losses due to 'skin effect' observed in microelectronics. At high frequency, the current may concentrate along the skin of the conductor leading to resistive losses. The skin depth has to be much greater than the surface undulations for this effect to be negligible. The skin depth, $\delta$, in meters, is given by Equation 1:

$$\delta \approx 503 \sqrt{\rho/(\mu_r f)}, \qquad 1)$$

where, $\mu_r$ is the relative permeability of the medium, $\rho$ is the resistivity in SI units, and f is the frequency. The skin depth at 60 GHz is about 1.2 µm for sintered silver nanoparticles. The observed roughness of four traces shown in FIG. 6B are shown in FIG. 7.

FIG. 7A shows the actual metallic trace surface profile, while FIG. 7B shows the same profiles as in FIG. 7A after the moving average has been subtracted from the profile to get a roughness estimate. Clearly, the roughness range is of the order of <300 nm (i.e. less than ±150 nm). The skin effect thus does not appear to affect the antenna performance at frequencies of interest. It is to be noted that the trace width is within about 10% of the mean for 5 printed traces, a variation comparable to the traces obtained using lithography.

Figure 8A:
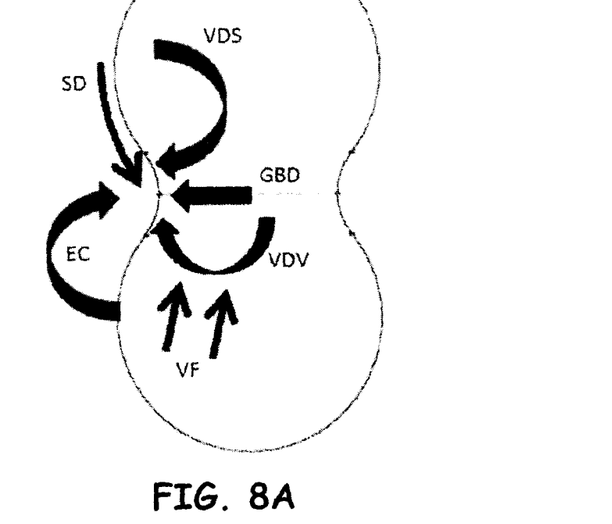
FIG. 8A shows a schematic of the mechanism using sintered Ag nanoparticles.
Figure 8B:
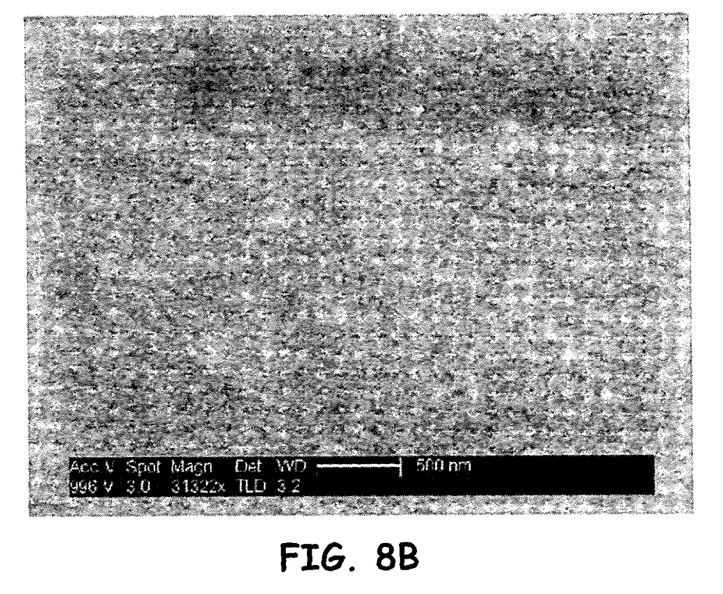
FIG. 8B shows an example of a metal trace with sintered nanoparticles using an Ag ink.

The sintering bonds the nanoink particles in a coherent or organized way by the mechanism of mass transport in atomic scale. The driving force for sintering of micro/nanoparticles of a system is the chemical potential gradient due to surface curvature. Different mass transport phenomena are active in the material movement in the sintering particles. Generally, the six dominant mass transport mechanisms are active during sintering are: (i) evaporation and condensation (EC), (ii) surface diffusion (SD), (iii) grain boundary diffusion (GDB), (iv) volume diffusion from the surface of the particle (VDS), (v) volume diffusion from the interior of the particle (VDV) and (vi) viscous flow (VF). In SD, EC and VDS fills the area between the particles. As a result of sintering, the mass center of the particles approach each other, creating a continuous film. FIG. 8 schematic illustrates the mechanism Ag nanoparticles and FIG. 8B shows an example of a metal trace with sintered nanoparticles using an Ag ink to create the structures illustrated in FIGS. 5A-E and FIGS. 6A-D.

It is to be understood that features described with regard to the various embodiments herein may be mixed and matched in any combination without departing from the spirit and scope of the invention. Although different selected embodiments have been illustrated and described in detail, it is to be appreciated that they are exemplary, and that a variety of substitutions and alterations are possible without departing from the spirit and scope of the present invention.

We claim:

1. A method for manufacturing of three dimensional sub-millimeter elements, comprising:
   dispensing a dielectric material on one or more positions on a substrate so as to provide one or more three dimensional dielectric structures having a high aspect ratio of up to 1:20 extending from the substrate;
   in-situ curing of the one or more three dimensional dielectric structures upon dispensing the dielectric material at the one or more positions, wherein the in-situ curing coupled with the dispensing of the dielectric material provides for three dimensional configurations of the one or more three dimensional dielectric structures;
   direct printing a metal nanoparticle solution on the one or more three dimensional dielectric structures at the one or more positions to create one or more conductive traces on the one or more three dimensional dielectric structures; and
   sintering thereafter the printed nanoparticle solution so as to cure the conductive traces, thereby forming the three dimensional elements, wherein the three dimensional elements have a sub-millimeter length and width scale of down to 1 µm.

2. The method of claim 1, wherein the sintering step forms the three dimensional elements that further comprises three dimensional sub-mm wavelength (<1 mm) sub-THz (<1000 GHz) frequency antennas directly printed over the three dimensional dielectric structures.

3. The method of claim 2, wherein dispensing of the dielectric material on the substrate includes dispensing of the dielectric material at one or more positions on one or more silicon integrated chips operating as one or more substrates, and wherein the forming of the three dimensional elements comprises forming one or more monopoles on the one or more silicon integrated chips so as to provide three dimensional sub-mm wavelength (<1 mm) sub-THz 1000 GHz) frequency antennas configured to be capable of ultra-high speed chip-to-chip communication.

4. The method of claim 1, wherein dispensing of the dielectric material on the substrate includes dispensing at one or more positions on an integrated chip operating as the substrate.

5. The method of claim 1, wherein prior to dispensing of the dielectric material, a dielectric permittivity of the dielectric material is modulated by mixing it with high permittivity particles as to form a functionally graded dielectric dispense material.

6. The method of claim 1, wherein the sintering step forms the three dimensional elements that further comprises one or more passive components directly printed over the three dimensional dielectric structures.

7. The method of claim 1, wherein the sintering step further comprises: sintering the direct printed nanoparticle solution by an external energy source.

8. The method of claim 1, wherein the in-situ curing further comprises: instantaneously curing the three dimensional dielectric structures by an external energy source during the dispensing of the dielectric material.

9. The method of claim 1 wherein dispensing of the dielectric material on a substrate includes dispensing the dielectric material at one or more positions on at least one substrate, the dielectric material selected from: silicon, silicon nitride; glass; germanium, aluminum antimonide, indium tin oxide (ITO); ITO-coated glass; and polymers (e.g., polyethylene naphthalate (PEN), polyetherimides, polyamide and polyamide-imides).

10. The method of claim 1, wherein the step of direct printing the metal nanoparticle solution further comprises: direct printing at least one metal nanoparticle solution that further comprises at least one of: silver, carbon, copper, gold, platinum, aluminum, and palladium.

11. The method of claim 1, wherein dispensing of the dielectric material and of direct printing of the metal nanoparticle solution includes controlling dispensing of the dielectric material based on a first target structure profile selected from circular, rectangular, convex, and concave profiles with constant or varying cross sections and direct printing of the metal nanoparticle solution based on a second target structure profile for antenna elements, wherein the first target structure profile and the second target structure profile are provided by a computer aided design (CAD).

12. The method of claim 1, wherein dispensing of the dielectric material and of direct printing of the metal nanoparticle solution includes dispensing and direct printing at an angle between 0 degrees and 89 degrees from a vertical direction with respect to the substrate.

* * * * *